(12) United States Patent
Buchanan et al.

(10) Patent No.: US 6,511,876 B2
(45) Date of Patent: Jan. 28, 2003

(54) HIGH MOBILITY FETS USING Al2O3 AS A GATE OXIDE

(75) Inventors: Douglas A. Buchanan, Cortlandt Manor, NY (US); Alessandro C. Callegari, Yorktown Heights, NY (US); Michael A. Gribelyuk, Poughquag, NY (US); Paul C. Jamison, Hopewell Junction, NY (US); Deborah Ann Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/888,777

(22) Filed: Jun. 25, 2001

(65) Prior Publication Data
US 2002/0197789 A1 Dec. 26, 2002

(51) Int. Cl.$^7$ ............................................ H01C 21/8242
(52) U.S. Cl. ...................... 438/240; 438/287; 438/785; 438/591; 438/624
(58) Field of Search ................................ 438/240, 287, 438/785, 909, 591, 393, 763, 624

(56) References Cited

U.S. PATENT DOCUMENTS

| | | | | |
|---|---|---|---|---|
| 5,407,870 A | * | 4/1995 | Okada et al. ............... 257/411 |
| 5,998,236 A | * | 12/1999 | Roeder et al. ............... 438/104 |
| 6,218,260 B1 | * | 4/2001 | Lee et al. .................... 438/240 |
| 6,319,766 B1 | * | 11/2001 | Bakli et al. .................. 438/240 |
| 6,426,308 B1 | * | 7/2002 | Park et al. ................... 438/785 |
| 2002/0052124 A1 | * | 5/2002 | Raaijmakers et al. ........ 438/778 |
| 2002/0115252 A1 | * | 8/2002 | Haukka et al. .............. 438/240 |

OTHER PUBLICATIONS

Science-and-Technology-of-Advanced-Materials (UK), vol. 1.No.3, p. 187–90., Published: Elsevier.*

G.D. Wilk, R.M. Wallace, J.M.Anthony, May 15, 2001, Applied Physics Review, vol. 89, p. 5243.*

* cited by examiner

Primary Examiner—Olik Chaudhuri
Assistant Examiner—William C Vesperman
(74) Attorney, Agent, or Firm—Scully, Scott, Murphy & Presser; Robert M. Trepp, Esq.

(57) ABSTRACT

A method of forming a high-k dielectric material which exhibits a substantially lower amount of trap charge within a gate stack region is provided. The method maintains high-temperatures (250° C. or above) such that the substrate wafer is not cooled during the various processing steps. Such a method leads to the formation of a high-k dielectric material which does not exhibit a hysteric behavior in a capacitance-voltage curve as well as an increased mobility on FETs using conventional CMOS processing.

38 Claims, 4 Drawing Sheets

HIGH MOBILITY FETS USING Al2O3 AS A GATE OXIDE

FIELD OF THE INVENTION

The present invention relates to semiconductor devices, and more particularly to a method of forming a dielectric material for use in an electronic semiconductor device such as a field effect transistor (FET). Additionally, the method of the present invention can also be used in forming a capacitor.

BACKGROUND OF THE INVENTION

In the semiconductor industry, dielectric materials in high-density circuits appear as capacitors in dynamic random access memory (DRAM) applications, gate dielectrics in transistors and as decoupling capacitors. The dielectric materials in these structures are typically silicon dioxide, $SiO_2$, which has a dielectric constant of about 4.0. As today's generation of circuits become smaller and smaller, the dielectric materials employed therein must be made thinner to satisfy circuit requirements.

The use of thin, low dielectric constant materials in today's generation of circuits is undesirable since such materials lead to leaky circuits and therefore large power consumption. Thus, it would be beneficial if the dielectric constant of the dielectric material used in such circuits could be increased. By increasing the dielectric constant, thicker oxides with a lower leakage current could be obtained which are electrically equivalent to thinner $SiO_2$.

In semiconductor field effect transistor devices, for example, $SiO_2$ gate oxide leakage currents are rapidly increasing as device dimension are shrinking. For devices containing a gate length of about 100 nm or less, $SiO_2$ may not be able to be used for future microprocessors and memory chips.

Most of the current research is in developing high dielectric constant, i.e., high-k, dielectrics that are based upon binary metal oxides and silicates; See, for example, G. D. Wilk, et al., J. Appl. Phys., 89 (2001), page 5243 and other references cited therein. Recently, it has been demonstrated that $Al_2O_3$ NFETs (k=10) with an effective channel length, $1_{\text{eff}}$, of 0.08 µm, show more than 100×reduction in leakage currents and equal or better reliability than $SiO_2$ at room temperature. The foregoing results have been published by D. A. Buchanan, et al., IEDM Technical Digest (2000), page 223. A standard polysilicon, i.e., poly Si, FET process was employed in the Buchanan, et al. article except that $Al_2O_3$ was employed as the gate dielectric instead of $SiO_2$. Generally, in such a process, cooling of the substrate occurs prior to formation of the binary metal oxide thereon.

One main problem with the prior art approach mentioned above is that the devices, i.e., NFETs, containing $Al_2O_3$ as a gate dielectric show a much-reduced mobility (a 5×reduction) as compared to $SiO_2$. The term "mobility" as used herein denotes the ability of electrons or holes in the semiconductor to move from one end of the channel to the other end. High channel mobility using a given gate dielectric material is important in the semiconductor industry. High channel mobility and therefore faster switching speeds are achieved by reducing trapped charge in the gate stack region. Reduced trapped charge leads to a device which does not exhibit hysteresis in the capacitance-voltage curve. Such a hysteric behavior in the capacitance-voltage curve is shown, for example, in FIG. 1.

In view of the above drawbacks mentioned with prior art high-k dielectrics, there is a continued need for developing a new and improved method of forming a high-k dielectric on the surface of a substrate wherein the mobility of charge carriers within the channel is significantly increased as compared with high-k dielectrics that are prepared by conventional processes.

SUMMARY OF THE INVENTION

One object of the present invention is to provide a high-k dielectric material.

Another object of the present invention is to provide a high-k dielectric material which exhibits low leakage current that is on the order of about 1 $A/cm^2$ or less at its operating potential.

A further object of the present invention is to provide a high-k dielectric material which provides an increased mobility by reducing trapped charge or moving said charge away from the underlying semiconductor substrate.

A yet further object of the present invention is to provide a high-k dielectric film that is made using processing steps that are compatible with existing complementary metal oxide semiconductor (CMOS) processing steps.

These and other objects and advantages are obtained in the present invention by providing a method wherein the wafer is kept at elevated temperatures (of about 250° C. or above) during the entire process. That is, during the various processing steps of the present invention, especially during the transfer from one reactor chamber to another, the wafer is not allowed to cool to room temperature. By maintaining the temperature of the wafer at about 250° C. or above, a large improvement in electrical characteristics, particularly the mobility, is observed. While not be bound by any theory, it is believed that by not allowing the wafer to cool, a cleaner process with less contaminants is obtained.

Specifically, the inventive method of the present invention comprises the steps of:

(a) placing a substrate in a first reactor chamber;

(b) forming an interfacial dielectric layer on an upper surface of said substrate at a temperature of about 300° C. or above;

(c) transferring said substrate from said first reactor chamber to a second reactor chamber in a controlled gaseous ambient or vacuum, while maintaining said substrate at a temperature of about 300° C. or above; and (d) forming a high-k dielectric material atop said interfacial dielectric layer.

In accordance with the present invention, the substrate may optionally be transferred to another reactor chamber wherein a gate contact is formed atop the high-k dielectric material. When such a transferring step is employed, the substrate including the high-k dielectric material may also be maintained at a temperature of about 300° C. or above. In another embodiment of the present invention, the substrate is cooled after deposition of the high-k dielectric material, and the gate contact is formed in a separate system.

It is noted that the term high-k dielectric material includes any dielectric material that has a dielectric constant that is higher than $SiO_2$. Examples of such high-k dielectric materials include, but are not limited to: metal oxides such as $Al_2O_3$, $ZrO_2$, $HfO_2$, or $Ta_2O_5$; perovskite-type oxides; metal silicates; metal nitrides; and any combination or multilayer thereof. In a preferred embodiment, the high-k dielectric is a metal oxide, with $Al_2O_3$ being one preferred metal oxide.

DETAILED DESCRIPTION OF THE INVENTION

Figure 1:
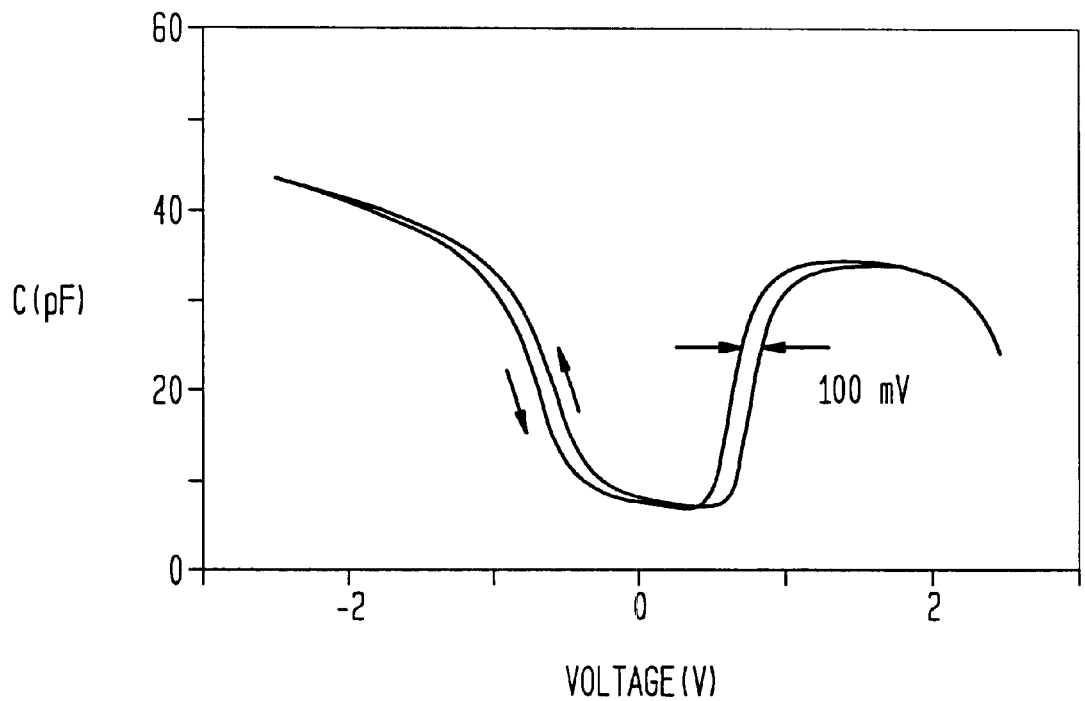
FIG. 1 is a curve of capacitance, C, (pF) vs. voltage, V, of a prior art FET device (area of about 2.5E-5 $cm^2$ and equivalent oxide thickness of about 13.0 Å) wherein $Al_2O_3$ was employed as the gate dielectric. Note that the hysterisis curve shown is indicative of charge trapping.

The present invention, which provides a method of forming a high-k dielectric film using a process in which the temperature is maintained at about 250° C. or above during the entire process, will now be described in greater detail by referring to the drawings that accompany the present invention. It is noted that in the accompanying drawings, like and/or corresponding elements are referred to by like reference numerals.

Figure 2A:
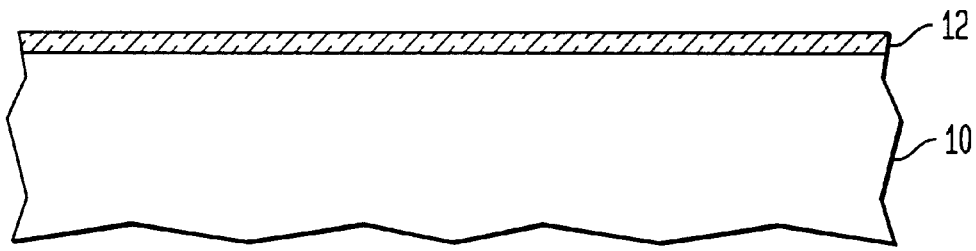
FIGS. 2A–2D are pictorial representations (through cross-sectional views) showing the various processing steps of the present invention.

Reference is first made FIGS. 2A–2D which illustrate an FET formed utilizing processing steps that include the method of the present invention. Specifically, FIG. 2A illustrates a structure that formed after interfacial dielectric layer 12 is formed on an upper surface of semiconductor substrate 10.

The structure shown in FIG. 2A is comprised of conventional materials well known in the art. For example, semiconductor substrate 10 is comprised of a semiconductor material including, but not limited to: Si, Ge, SiGe, GaAs, InAs, InP and all other III/V or II/VI semiconductor compounds. Semiconductor substrate 10 may also include a layered substrate comprising the same or different semiconductor material, e.g., Si/Si or Si/SiGe, as well as a silicon-on-insulator (SOI) substrate. The substrate may be of the n- or p-type depending on the desired polarity of the device to be fabricated.

Additionally, semiconductor substrate 10 may contain active device regions, wiring regions, isolation regions or other like regions that are typically present in CMOS-containing devices. For clarity, these regions are not shown in the drawings, but are nevertheless meant to be included within region 10. In one highly preferred embodiment of the present invention, semiconductor substrate 10 is comprised of Si.

In one embodiment of the present invention, the substrate is subjected to a treatment step prior to forming the interfacial dielectric layer thereon. In this embodiment of the present invention, any conventional process which is capable of forming a hydrogen terminated surface layer on the substrate can be employed. For example, a DHF dip process may be used in the present invention to form a hydrogen terminated surface layer on the surface of substrate 10.

The substrate, which may be optionally treated in the above manner, is then placed within a first reactor chamber of a reaction vessel and after locking and evacuating to a desired pressure range, interfacial dielectric layer 12 is formed on the surface of the substrate at a temperature of about 300° C. or above, preferably the interfacial dielectric film is formed at a temperature of from about 650° to about 1200° C. The reaction vessel employed in the present invention includes any multi-chamber reaction vessel well known to those skilled in the art that is capable of at least forming a plurality of films on a surface of a substrate.

The interfacial dielectric layer may be comprised of an oxide, nitride, oxynitride or any combination thereof including multilayers. A highly preferred interfacial oxide layer employed in the present invention is an oxynitride.

When an oxynitride is employed as interfacial dielectric layer 12, the interfacial dielectric layer is formed in the presence of any oxygen/nitrogen-containing ambient which may, optionally, be admixed with an inert gas. Suitable oxygen/nitrogen-containing ambients include, but are not limited to: NO, $NO_2$, $N_2/O_2$, $N_2O$ and any mixtures thereof. The term "inert gas" as used herein denotes He, Ar, Ne, Kr, Xe, $N_2$ and mixtures thereof.

In one preferred embodiment, the interfacial dielectric layer is formed in an oxygen/nitrogen-containing ambient that comprises from about 2% to 20% NO which is admixed in $N_2$. Preferably, the oxynitride interfacial dielectric layer is formed at a temperature ranging from about 600° to about 900° C.

When an oxide or nitride layer is employed, a conventional oxidation or nitridation process may be employed in forming the same.

The interfacial dielectric layer may be formed utilizing rapid thermal conditions, or alternatively, furnace conditions may be employed in forming the same. When rapid thermal conditions are employed in forming the interfacial dielectric layer, interfacial dielectric layer 12 is formed at the above temperatures for a time period of about 120 seconds less, preferably for a time period of from about 5 to about 60 seconds. When furnace conditions are employed, interfacial dielectric layer 12 is formed at the above temperatures for a time period of from about 2 minutes or greater, with a time period of from about 5 to about 10 minutes being more highly preferred.

It is noted that the above conditions for forming the interfacial dielectric layer are exemplary and that other conditions well known to those skilled in the art can be used so as long as the temperature of interfacial dielectric layer formation is about 300° C. or above.

The thickness of the interfacial dielectric layer formed at this point of the present invention is not currently critical to the inventive process, but typically the interfacial dielectric layer has a thickness of from about 0.2 to about 2 nm, with a thickness of from about 0.5 to about 1.2 nm being more highly preferred.

Next, the substrate containing the interfacial dielectric layer is transferred to a second reactor chamber within the vessel wherein high-k dielectric film 14 is formed atop interfacial dielectric layer 12. It should be noted that during the transferring process from the first reactor chamber to the second reactor chamber, the temperature of the substrate including interfacial dielectric layer 12 is maintained at about 300° C. or above. More preferably, the substrate containing interfacial dielectric layer 12 is maintained at temperature of from about 300° to about 700° C. during the entire transfer process.

It is noted that during the entire transferring process, the substrate including interfacial dielectric layer 12 is maintained within a controlled gaseous ambient or in a vacuum (pressure of from about 200 mT to about 1E-8 Torr). Illustrative examples of controlled gaseous ambients that can be employed in the present invention include, but are not limited to: inert gas such as He, Ar, $N_2$, Ar, Kr, Xe, Ne and mixtures thereof. A highly preferred gaseous ambient employed during the transferring of the substrate from the first to second rector chamber is $N_2$.

Figure 2B:
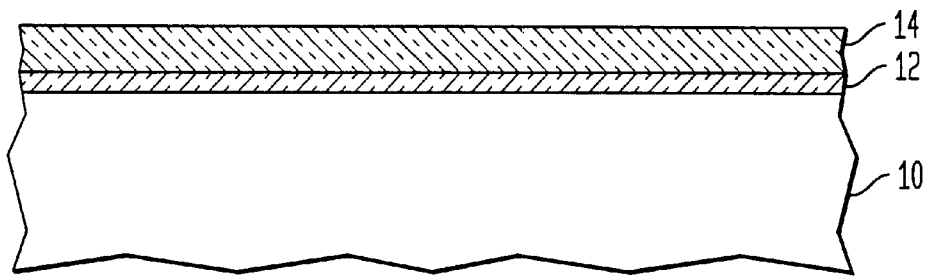
Figure 2C:
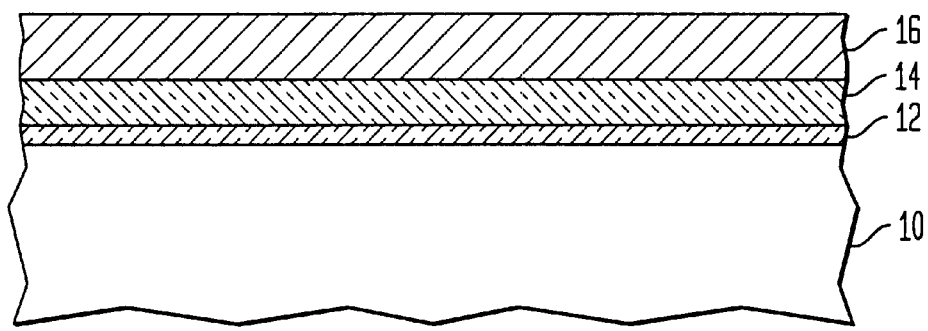

As stated above, a layer of high-k dielectric material 14 is then formed on a surface of interfacial dielectric layer 12 providing the structure shown, for example, in FIG. 2B. The layer of high-k dielectric material may be formed utilizing a conventional deposition process such as chemical vapor deposition (CVD), plasma-assisted CVD, evaporation, chemical solution deposition, atomic layer deposition (ALD), metal oxide CVD (MOCVD) or any other like deposition process. Preferred deposition processes used in forming high-k dielectrics include ALD and MOCVD. The MOCVD process may be carried out using the conditions disclosed in co-assigned U.S. application Ser. No. 09/676, 882, filed Sep. 29, 2000, the entire content of which is incorporated herein by reference.

Notwithstanding the type of deposition process used in forming the high-k dielectric, the deposition temperature used in forming the high-k dielectric is from about 250° C. or above, with a deposition temperature of from about 250° to about 700° C. being more highly preferred.

The thickness of the layer of high-k dielectric material is not critical to the present invention, but typically, the high-k dielectric material has a thickness of from about 0.5 to about 100 nm after deposition, with a thickness of from about 1 to about 40 nm being more highly preferred. It is noted that the high-k dielectric material employed in the present invention is any dielectric having a dielectric constant higher than $SiO_2$, ie., 4.0 or more. More preferably, the high-k dielectric material of the present invention has a dielectric constant of about 7 or greater, with a dielectric constant of from about 10 to about 50 being more highly preferred.

The high-k dielectrics that can formed in the present invention include, but are not limited to: metal oxides such as $ZrO_2$, $Ta_2O_5$, $HfO_2$ or $Al_2O_3$; perovskite-type oxides; metal silicates; metal nitrates; and combinations or multi-layers thereof, i.e., a stack of high-k dielectrics.

It is noted that the term perovskite-type oxides denotes a material that includes one acidic oxide containing at least one metal selected from Group IVB (Ti, Zr or Hf), Vb (V, Nb or Ta), VIB (Cr, Mo or W), VIIB (Mn or Re), IIIA (Al, Ga or In) or IB (Cu, Ag or Au) of the Periodic Table of Elements (CAS version) and at least one additional cation having a positive formal charge of from about 1 to about 3. Such perovskite-type oxides typically, but not always, have the basic formula: $ABO_3$, wherein A is one of the above-mentioned cations and B is one of the above-mentioned metals. Crystalline as well as amorphous forms of such perovskite-type oxides are contemplated herein.

Suitable perovskite-type oxides that can be employed in the present invention include, but are not limited to: a titanate system material such as barium titanate, strontium titanate, barium strontium titanate, lead titanate, lead zirconate titanate, lead lanthanum zirconate titanate, barium lanthanum titanate and barium zirconium titanate; an aluminate such as lanthanum aluminate and yttrium aluminate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and a Bi-layered perovskite system material such as strontium bismuth tantalate, and bismuth titanate.

Of the above-mentioned high-k dielectrics, it is highly preferred that a metal oxide be employed as the high-k dielectric material. Of the various metal oxides, $Al_2O_3$ has been exemplified herein.

After forming the high-k dielectric material on the surface of interfacial dielectric layer 12, the substrate including interfacial dielectric layer 12 and high-k dielectric 14 may be optionally transferred from the second reactor chamber to a third reactor chamber wherein a gate contact will be subsequently formed on the high-k dielectric. Note that during the transfer step, the temperature of the substrate may also be maintained at about 300° C. or above (preferably from about 300° to about 500° C.) using the same or different controlled gaseous ambient or vacuum as mentioned above.

In another embodiment of the present invention, the gate contact is formed in a separate system from that used in forming the interfacial dielectric material and the high-k dielectric. In such an embodiment, the substrate including interfacial dielectric material and high-k dielectric is cooled and transferred to another system in air.

Gate contact 16, which includes at least a gate material, is then formed on the high-k dielectric material; See FIG. 2C. The term "gate material" as used herein denotes a conductive material, a material that can be made conductive via a subsequent process such as ion implantation, or any combination thereof. Illustrative examples of suitable gate materials include, but are not limited to: polysilicon, amorphous silicon, elemental metals that are conductive such as W, Pt, Pd, Ru, Rh, Re and Ir, alloys of these elemental metals, silicide or nitrides of these elemental metals and combinations thereof, e.g., a gate stack including a layer of polysilicon and/or a layer of conductive metal. A highly preferred gate material employed in the present invention is a gate material that is comprised of polysilicon or amorphous silicon.

The gate material is formed on the surface of the high-k dielectric material utilizing a conventional deposition process including, but not limited to: CVD, plasma-assisted CVD, evaporation, plating or chemical solution deposition. When metal silicides are employed, a conventional silicide process may be used in forming the silicide layer. One such silicide process that can be used in the present invention includes the steps of: first forming an elemental metal on the gate dielectric material, annealing the layers so as to form a metal silicide layer therefrom, and removing any unreacted elemental metal utilizing a conventional wet etch process that has a high selectivity for removing elemental metal as compared to silicide.

When polysilicon is employed as the gate material, the polysilicon layer may be formed utilizing an in-situ doping deposition process or by a conventional deposition process followed by ion implantation. Note that the ion implantation step may be formed immediately after deposition of the polysilicon layer, or in a later step of the present invention, i.e., after patterning of the gate stack.

It is noted that in embodiments wherein a gate stack including a layer of polysilicon and a layer of conductive elemental metal is employed, an optional diffusion barrier (not shown in the drawings) may be formed between each layer of the gate stack. The optional diffusion barrier, which is formed utilizing a conventional deposition process such as CVD or plasma-assisted CVD, is comprised of a material such as SiN, TaN, AlN, TaSiN, WN, TiN, and other like materials which can prevent diffusion of a conductive material therethrough.

Figure 2D:
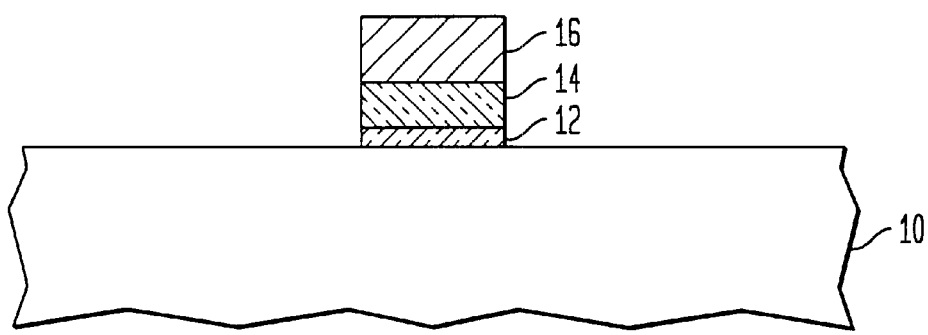

After forming the gate contact on the high-k dielectric material, the substrate is cooled to room temperature and thereafter it is removed from the reactor chamber. The cooled substrate is then patterned utilizing conventional processing steps well known in the art which are capable of forming the patterned structure shown in FIG. 2D. Specifically, the structure shown in FIG. 2D is formed by lithography, material deposition and etching.

The lithography step includes the following: applying a photoresist (not shown in the drawings) to the top surface of the gate contact, exposing the photoresist to a pattern of radiation and developing the pattern utilizing a conventional resist developer solution.

Etching is typically performed utilizing a conventional dry etching process such as reactive-ion etching, plasma etching, ion beam etching, laser ablation or a combination thereof. The etching step may remove portions of the gate contact and the underlying high-k dielectric material and interfacial dielectric layer that are not protected by the patterned photoresist in a single step, or alternatively, multiple etching steps may be performed wherein the exposed portions of the gate contact is first removed stopping on a surface of the high-k dielectric material, thereafter the exposed portions of the high-k dielectric are removed stopping on the surface of interfacial dielectric layer 12, and thereafter the exposed portions of the interfacial dielectric layer are removed stopping on semiconductor substrate 10. Following the etching process, the patterned photoresist is removed utilizing a conventional stripping process well known in the art providing the structure shown, for example, in FIG. 2D.

At this point of the present invention, and if not previously done, the patterned gate contact region may be subjected to a conventional ion implantation step and an activation annealing process. Additionally, various implants which are capable of forming source/drain extension regions and halo implants (not shown in the drawings) may be performed. After each implant, an activation annealing process may be performed, or alternatively, each implant region, including the gate stack, may be activated utilizing a single activation annealing process.

Note that the deep source/drain diffusion regions (not shown in the drawings) are formed utilizing conventional processes (i.e., ion implantation and annealing) anytime after the spacers (also not shown) are formed on the exposed vertical sidewalls of the structure shown in FIG. 2D.

Figure 3:
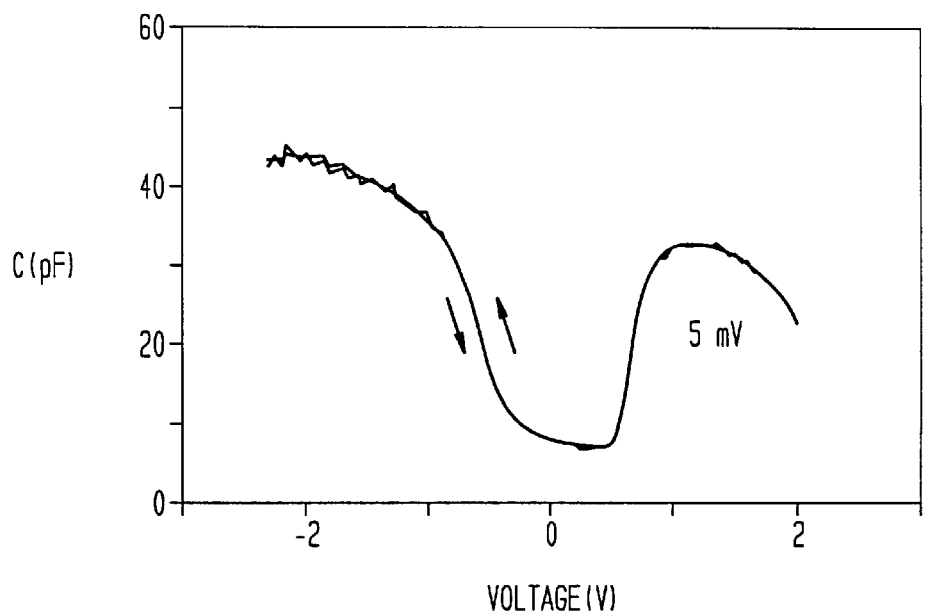
FIG. 3 is curve of capacitance, C, (pF) vs. voltage, V, of an FET device prepared utilizing the method of the present invention. Note that the FET device has approximately the same area and equivalent oxide thickness as the prior art FET device employed in FIG. 1.

FIG. 3 shows the capacitance-voltage curve of an FET device which was made in accordance with the inventive processing steps mentioned above. Note that the curve shows substantially no hysterisis; therefore the inventive FET which includes $Al_2O_3$ as the gate dielectric has reduced charge trapping as compared to the FET shown in FIG. 1.

Figure 4:
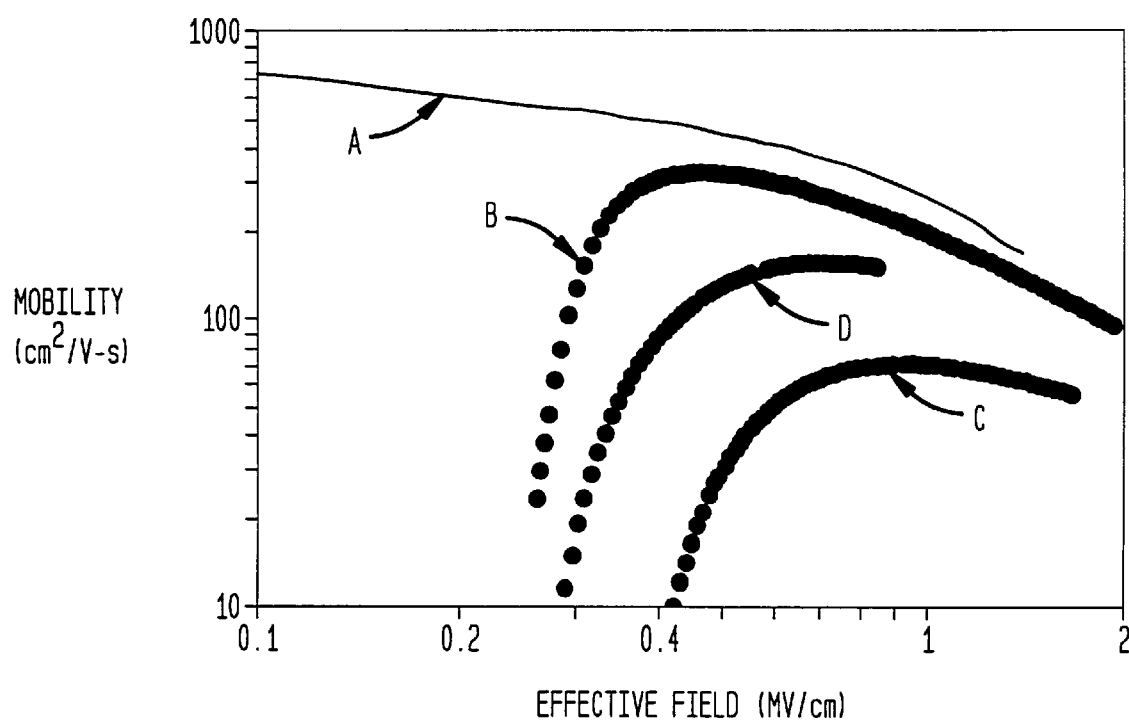
FIG. 4 is a curve of mobility ($cm^2$/V-s) vs. Effective Field (MV/cm) for various gate n-FETs; A is universal Takagi curve (S. Takagi, et al., IEEE Trans. Elec. Dev., Vol. 41, pp 2357–2362, 1994), B is $SiO_2$, C is prior art $Al_2O_3$ wherein the substrate is cooled between oxynitride growth and $Al_2O_3$ formation; and D is $Al_2O_3$ prepared using the present invention.

FIG. 4 shows the mobility-Effective Field curve for various gate n-FETs. In this figure A is universal Takagi curve, B is $SiO_2$, C is prior art $Al_2O_3$ wherein the substrate is cooled between oxynitride growth and $Al_2O_3$ formation; and D is $Al_2O_3$ prepared using the method of the present invention. The peak mobility for the prior art process which allows cooling between oxynitride formation and $Al_2O_3$ formation is about 70 $cm^2$/V-s, which agrees with previous work reported in the Buchanan, et al. article mentioned in the background section of the application. A significant improvement in mobility (or about 2x) is obtained when the inventive process is employed. This data is consistent with the reduced trapped charge found in the non-hysteric behavior of the high frequency capacitance-voltage curve shown in FIG. 3.

Figure 5:
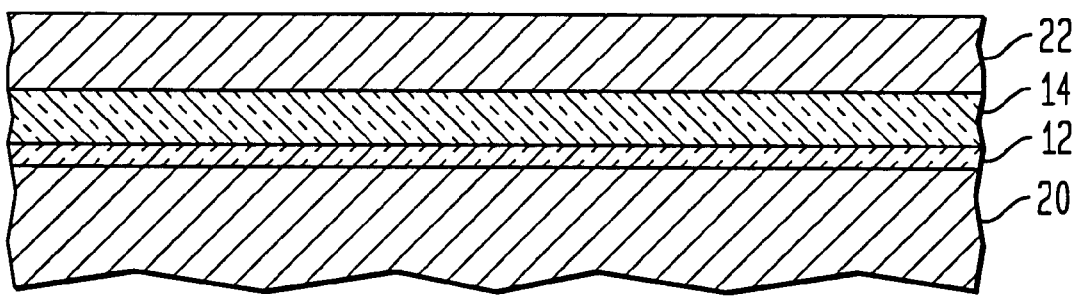
FIG. 5 is a pictorial representation of a capacitor structure that can be formed utilizing the processing steps of the present invention.

In another embodiment of the present invention, as shown in FIG. 5, high-k dielectric 14 is formed between two conductive electrode plates 20 and 22, respectively. Note that in this embodiment, the conductive electrode plates may comprise the same or different conductive material as mentioned above in regard to the gate contact. In such an embodiment, the bottom plate (i.e., reference numeral 20) of the capacitor is formed on a substrate (not shown) using one of the aforementioned deposition processes used in forming the gate material. Interfacial dielectric layer 12 is then formed on the bottom conductive plate using the processing steps mentioned hereinabove. Following deposition of the interfacial dielectric layer, high-k dielectric material 14 is formed as described above and thereafter top plate 22 is formed using one of the above-mentioned processes used in forming the gate contact. Note that during the formation of the capacitor device, the structure is maintained throughout the entire process at a temperature of about 250° C. or above and that the various elements of the capacitor are formed in a single reaction vessel which includes multiple reactor chambers.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a high-k dielectric material comprising the steps of:
   (a) placing a substrate in a first chamber;
   (b) forming an interfacial dielectric layer on an upper surface of said substrate at a temperature of about 300° C. or above;
   (c) transferring said substrate from said first chamber to a second chamber in a controlled gaseous ambient or vacuum, while maintaining said substrate at a temperature of about 300° C. or above; and
   (d) forming a high-k dielectric material having a dielectric constant of 4.0 or more atop said interfacial dielectric layer.

2. The method of claim 1 wherein said substrate comprises a semiconductor material selected from the group consisting of Si, Ge, SiGe, GaAs, InAs, InP, Si/Si, Si/SiGe and silicon-on-insulators.

3. The method of claim 1 wherein said substrate is Si.

4. The method of claim 1 wherein said substrate is treated so as to form a hydrogen terminated surface layer on the substrate prior to performing step (b).

5. The method of claim 4 wherein said substrate is treated with DHF.

6. The method of claim 1 wherein said temperature of said interfacial dielectric layer formation is from about 650° to about 1200° C.

7. The method of claim 1 wherein said interfacial dielectric layer is an oxide, nitride, oxynitride or mixtures and multilayers thereof.

8. The method of claim 7 wherein said interfacial dielectric layer is an oxynitride that is formed in the presence of an oxygen/nitrogen-containing ambient which comprises NO, $NO_2$, a $N_2$ and $O_2$ admixture or $N_2O$.

9. The method of claim 8 wherein said oxygen/nitrogen-containing ambient is admixed with an inert gas.

10. The method of claim 9 wherein said oxygen/nitrogen-containing ambient comprises from about 2% to about 20% NO and said inert gas is $N_2$.

11. The method of claim 10 wherein said interfacial dielectric layer is formed at a temperature of from about 600° to about 900° C.

12. The method of claim 1 wherein said interfacial dielectric layer is formed under rapid thermal conditions or furnace conditions.

13. The method of claim 12 wherein said rapid thermal conditions include a heating time of about 120 seconds or less.

14. The method of claim 13 wherein said rapid thermal conditions include a heating time of from about 5 to about 60 seconds.

15. The method of claim 12 wherein said furnace conditions include a heating time of about 2 minutes or greater.

16. The method of claim 15 wherein said furnace conditions include a heating time of about 5 to about 10 minutes.

17. The method of claim 1 wherein said temperature during said transferring step is from about 300° to about 700° C.

18. The method of claim 1 wherein said controlled gaseous ambient comprises He, Ar, $N_2$, Kr, Xe, Ne or mixtures thereof.

19. The method of claim 18 wherein said controlled gaseous ambient comprises $N_2$.

20. The method of claim 1 wherein said high-k dielectric has a dielectric constant of from about 7.0 or above.

21. The method of claim 1 wherein said high-k dielectric is a dielectric material selected from the group consisting of metal oxides, metal nitrides, metal silicides, perovskite-type oxides and combinations or multilayers thereof.

22. The method of claim 21 wherein said high-k dielectric is a metal oxide selected from the group consisting of $Al_2O_3$, $HfO_2$, $ZrO_2$ and $Ta_2O_5$.

23. The method of claim 22 wherein said metal oxide is $Al_2O_3$.

24. The method of claim 1 wherein said high-k dielectric is formed by a deposition process selected from the group consisting of chemical vapor deposition (CVD, plasma-assisted CVD, evaporation, chemical solution deposition, atomic layer deposition and metal oxide CVD.

25. The method of claim 1 wherein said high-k dielectric is formed at a temperature of from about 250° to about 700° C.

26. The method of claim 1 further comprising transferring said semiconductor substrate having said interfacial dielectric layer and said high-k dielectric to a third reactor chamber, wherein said transferring is carried out in a controlled gaseous ambient or vacuum, while maintaining said substrate at a temperature of about 300° C. or above.

27. The method of claim 25 wherein said conductive material is polysilicon or amorphous silicon.

28. The method of claim 26 wherein a gate contact is formed atop said high-k dielectric in said third reactor chamber.

29. The method of claim 28 wherein said gate contact comprises a conductive material.

30. The method of claim 29 wherein said conductive material comprises polysilicon, amorphous silicon, elemental metals that are conductive, alloys of elemental metals that are conductive, silicides or nitrides of elemental conductive metals or combinations thereof.

31. The method of claim 26 further comprising cooling said substrate and removing said substrate containing said interfacial layer, said high-k dielectric, and said gate contact from said third reactor chamber.

32. The method of claim 31 further comprising patterning said interfacial dielectric layer, said high-k dielectric and said gate contact.

33. The method of claim 1 further comprising the step of cooling said substrate, transferring said substrate to a separate system, and forming a gate contact atop said high-k dielectric material.

34. A method of forming a high-k dielectric material comprising the steps of:

(a) placing a substrate having a surface layer terminated with hydrogen in a first chamber;

(b) forming an interfacial dielectric layer on an upper surface of said substrate at a temperature of about 300° C. or above;

(c) transferring said substrate from said first chamber to a second chamber in a controlled gaseous ambient, while maintaining said substrate at a temperature of about 300° C. or above; and (d) forming a high-k dielectric material having a dielectric constant of 4.0 or more atop said interfacial dielectric layer, wherein said high-k dielectric is a metal oxide.

35. The method of claim 34 wherein said metal oxide is selected from the group consisting of $Al_2O_3$, $HfO_2$, $ZrO_2$ and $Ta_2O_5$.

36. The method of claim 35 wherein said metal oxide is $Al_2O_3$.

37. The method of claim 34 wherein said metal oxide is formed by atomic layer deposition or metal oxide chemical vapor deposition.

38. A method of forming a capacitor comprising the steps of:

(a) forming a first plate electrode on a surface of a substrate within a first reactor chamber;

(b) forming an interfacial dielectric layer on an upper surface of said first plate electrode at a temperature of about 300° C. or above;

(c) transferring said substrate from said first chamber to a second chamber in a controlled gaseous ambient or vacuum, while maintaining said substrate at a temperature of about 300° C. or above;

(d) forming a high-k dielectric material having a dielectric constant of 4.0 or more atop said interfacial dielectric layer, and (e) forming a second plate electrode on a surface of said high-k dielectric.

* * * * *

UNITED STATES PATENT AND TRADEMARK OFFICE
CERTIFICATE OF CORRECTION

PATENT NO. : 6,511,876 B2
DATED : January 28, 2003
INVENTOR(S) : D. Buchanan et al.

It is certified that error appears in the above-identified patent and that said Letters Patent is hereby corrected as shown below:

<u>Title page, Item [54] and Column 1, line 1,</u>
"A1203" should read -- $Al_2O_3$ --

Signed and Sealed this

Twenty-second Day of July, 2003

JAMES E. ROGAN
*Director of the United States Patent and Trademark Office*